Figure 1:
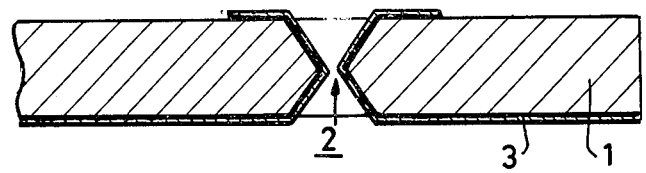

United States Patent [19]

Monnier et al.

[11] 4,238,527
[45] Dec. 9, 1980

[54] METHOD OF PROVIDING METAL BUMPS ON AN APERTURED SUBSTRATE

[75] Inventors: Michel J. C. Monnier, Montgeron; Marc A. Monneraye, Saint Maur; Claude Foucher, Palaiseau, all of France

[73] Assignee: U.S. Philips Corporation, New York, N.Y.

[21] Appl. No.: 941,179

[22] Filed: Sep. 11, 1978

[30] Foreign Application Priority Data

Sep. 12, 1977 [FR] France .............................. 77 27445

[51] Int. Cl.³ .............................................. H05K 3/10
[52] U.S. Cl. ..................................... 427/55; 174/68.5; 427/97; 361/400
[58] Field of Search ................... 427/97, 55; 174/68.5; 361/398, 400, 406, 419

[56] References Cited

U.S. PATENT DOCUMENTS

| 3,700,538 | 10/1972 | Kennedy | 174/68.5 |
|---|---|---|---|
| 3,786,172 | 1/1974 | Cowley | 361/406 |
| 3,832,769 | 9/1974 | Olyphant, Jr. | 361/398 |
| 4,118,523 | 10/1978 | Bingham | 427/97 |

Primary Examiner—Gerald P. Tolin
Attorney, Agent, or Firm—Thomas A. Briody; William J. Streeter; Rolf E. Schneider

[57] ABSTRACT

Method of providing metal bumps on an apertured substrate and substrate having metal bumps.

2 Claims, 4 Drawing Figures

METHOD OF PROVIDING METAL BUMPS ON AN APERTURED SUBSTRATE

The invention relates to a method of realizing meltable metal bumps on the surface of a substrate at the area of holes previously provided in said substrate, the upper surface of said substrate being provided with metallized areas. The invention also relates to a substrate having the metal soldering bumps.

According to the invention a resin of controlled viscosity is deposited on the substrate after which the bumps are formed by heating, preferably by means of infrared radiation.

The invention relates to a method of providing meltable metal bumps on the surface of an insulating substrate which is provided with metal conductors, said substrate having metallized holes, the metallization of the holes being connected to the conductors and at least said metallization being covered with a meltable soldering material.

The invention also relates to a substrate having metal bumps. The invention will find application in the field of electronics and more particularly micro-electronics. It presents a new bonding technique which can be applied to the increasing miniaturization of elementary electronic components. Numerous bonding techniques are known from the prior art. In one of the known binding techniques, metal wires are connected one by one to a connection pad of an elementary semiconductor element, usually by thermo-compression. In another bonding technique metal bumps are previously provided on the connection pads of the semiconductor element, the bumps of the semiconductor element being soldered simultaneously to metallized areas on a substrate.

A further bonding technique is known which consists of the use of a previously apertured flexible substrate which is metallized on both sides and in the holes. The connection pads of the semiconductor element are positioned relative to the metallized holes of the said substrate and are bonded to it. Although this embodiment presents important advantages, especially as regards avoiding parasitic contacts, it has restrictions which are inherent in the method: the connection pads of the semiconductor element must necessarily have dimensions which are larger than those of the metallized holes to ensure a good bonding and a good adhesion of the semiconductor element to the substrate.

The present invention permits of mitigating the above-mentioned disadvantage especially by such a reduction of the dimensions of the connection pads of the semiconductor element that the dimensions thereof may be smaller than those of the metallized holes.

According to the invention the method is characterized in that a resin is provided on a surface of the substrate at least at the area of the holes, the viscosity of said resin being such that is cannot flow into the holes, and that the resin is heated at the area of the holes, due to which on the side of the resin facing the holes a spherical surface is formed adjoining the holes and remote therefrom, while soldering material melted as a result of the heating flows past said spherical surfaces and forms metal bumps after cooling.

In this manner metal bumps with dimensions substantially equivalent to those of the holes are formed on the upper part of the substrate at the area of each metallized hole.

The heating is preferably carried out by means of infrared radiation. In this manner the metal coating of the substrate, due to a larger radiation absorption, reaches a temperature which is higher than that of the resin, which facilitates the formation of the bumps.

Figure 2:
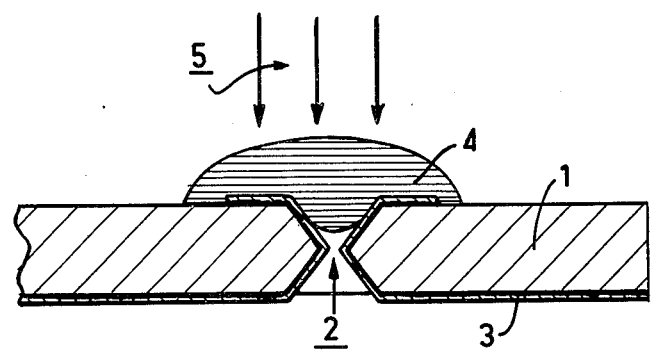
Figure 3:
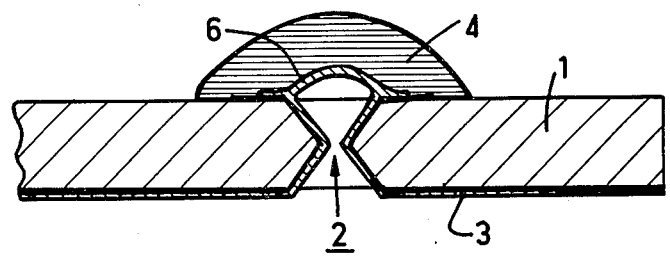

The invention will now be described in greater detail by way of example, with reference to the accompanying drawings, in which FIG. 1 is a cross-sectional view of a apertured substrate which is metallized on both sides, FIGS. 2 and 3 show diagrammatically the formation process of a bump.

Figure 4:
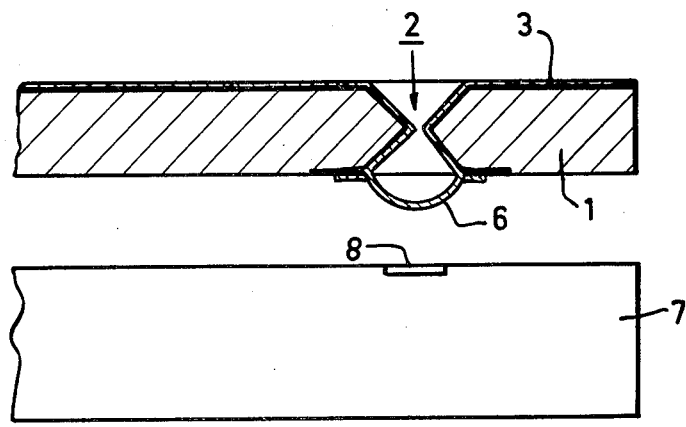

FIG. 4 shows diagrammatically the subsequent soldering of a semiconductor element on the substrate having bumps obtained in agreement with the invention. Identical elements are referred to by the same reference numerals.

FIG. 1 shows a substrate, for example a flexible film of polyimide, which is provided with holes by using a potassium solution of propanediol 1-2 and which is metallized on both sides, for example, as described in French Patent Application No. 2,320,361 laid open to public inspection. As a result of this treatment, the hole denoted in this Figure by 2 is metallized on the inside. The metallization 3 comprises as an outer layer a meltable metal or alloy, for example a tin-lead alloy which is frequently used in soldering of electronic equipment.

By the use of a solution for providing the holes, for example potassium propanediol 1-2, a hole as shown in FIG. 2 is formed on the two faces of the substrate by simultaneous piercing. It is usual to obtain holes having dimensions in the order of 50 $\mu$m at the surface and in the order of 20 $\mu$m in their narrowest part. After metallization the substrate surface around each hole shows, for example, a circular part having an outside diameter in the order of 100 $\mu$m.

A resin ball 4 which is so viscous that it cannot flow into the metallized hole 2 is now provided on the upper face of the substrate 1 at the area of the said hole 2 (see FIG. 2). More precisely, the resin should be chosen to be so that with respect to the dimensions of the hole the viscosity of the resin is sufficient to avoid flowing. With dimensions of the hole between 50 and 20 $\mu$m a viscosity higher than 100 poises was sufficient. By way of example and without any restriction to the invention, Applicants used for their experiments usually a resin which is adapted especially to micro-electronics and is marketed by Messrs. Alpha Metals Inc. under the name "Non-activated resin microflux 5002". Alternatively the whole substrate may be covered with the said resin. A metal bump 6 as shown in FIG. 3 is then formed as a result of the heating at the area of the hole 2. In fact, when the heating is suffficient the metal layer 3 is melted and the resin starts boiling; no doubt as a result of a double phenomenon, capillarity by comparatively small dimensions of the holes and aspiration by boiling of the resin, a metal bump is formed on the upper part of the hole. Heating must then be discontinued so as to avoid cracking of said bump.

According to a preferred embodiment of the invention, the above-described heating is carried out by means of infrared radiation 5. In this manner the metal layer 3 which absorbs said radiation more strongly than the resin reaches a higher temperature which, during the melting of the soldering alloy, facilitates the appearance of a bump upon contact with a relatively colder medium.

In a practical embodiment the metal layer 3 deposited by Applicants consisted, in sequence of provision, of a thin nickle layer in a thickness between 1000 and 2000 Å, a copper layer in a thickness of approximately 10 μm and finally a tin-lead (60-40) layer of a few μm thickness the melting temperature of which is comparatively low, in the order of 180° C. Under the influence of an infrared radiation with a power of 100 W which is provided on the side where the bump is to be formed, the tin-lead layer becomes fluid and a metal bump is formed upon contact with the relatively colder resin.

The object thus obtained in this step of the method is provided with metal bumps which are encapsulated by the resin initially deposited on the substrate so that a good surface state of the bumps is maintained, which facilitates a subsequent soldering. Prior to a soldering operation the resin is dissolved, for example by means of acetone, and soldering may then be carried out directly with a non-oxidized tin-lead layer. This additional advantage of the invention removes in particular the problems of storage and preservation.

An electronic component having metal contact surfaces may be soldered to the substrate. The contact surfaces are positioned relative to the metal bumps. The bumps start melting by simply heating; the element is drawn-in and secured at the area of the metallized hole, which ensures a perfectly reliable bond.

According to a very special application such a substrate may serve as a support of semiconductor body, as described with reference to FIG. 4. In this Figure a semiconductor body 7 provided with metallized connection pads may be soldered at the area of the metallized holes by means of metal bumps 6.

Whereas in the prior art the dimensions of the connection pad 8 exceed those of the metallized hole 2, within the scope of the present invention the dimensions of the connection pad 8 may be smaller—in the order of 20 μm—than those of the dimensions of the metallized hole—in the order of 50 μm.

It is, of course, possible to realize the mutual connection of a large number of semiconductor elements on an above-described metallized substrate which is provided with holes and soldering bumps, in which the largest possible density of active elements is obtained. A nonobvious advantage of this simultaneous soldering is that it is not necessary to produce bumps of the same dimensions at the area of each hole because after the melting thereof the semiconductor body will adhere to the substrate while the soldering alloy which penetrates into the hole 2 by capillary action solders the element in the manner of a rivet.

What is claimed is:

1. A method of providing meltable metal bumps on the surface of an insulating substrate which is provided with metal conductors, said substrate comprising metallized holes, the metallization of the holes being connected to the conductors and at least said metallization being covered with a meltable soldering material, characterized in that a resin is provided on a surface of the substrate at least at the area of the holes, the viscosity of said resin being such that it cannot flow into the holes and that the resin is heated at the area of the holes, due to which on the side of the resin facing the holes a spherical surface is formed adjoining the holes and remote therefrom, while soldering material melted as a result of the heating flows past said spherical surfaces and, after cooling, forms metal bumps.

2. A method as claimed in claim 1, characterized in that the resin is heated by means of infrared radiation.

* * * * *